(12) United States Patent
Zhang

(10) Patent No.: US 10,320,411 B1
(45) Date of Patent: Jun. 11, 2019

(54) HIGH ACCURACY PHASE SHIFT APPARATUS

(71) Applicant: Chengdu Sicore Semiconductor Corp. Ltd., Sichuan (CN)

(72) Inventor: Cemin Zhang, Diamond Bar, CA (US)

(73) Assignee: Chengdu Sicore Semiconductor Corp. Ltd., Sichuan (CN)

( * ) Notice: Subject to any disclaimer, the term of this patent is extended or adjusted under 35 U.S.C. 154(b) by 0 days.

(21) Appl. No.: 16/015,127

(22) Filed: Jun. 21, 2018

(30) Foreign Application Priority Data

Apr. 27, 2018 (CN) .......................... 2018 1 0388855

(51) Int. Cl.
| | |
|---|---|
| *H03M 1/66* | (2006.01) |
| *H03M 1/06* | (2006.01) |
| *H03H 17/08* | (2006.01) |
| *G05B 19/042* | (2006.01) |
| *H03M 1/12* | (2006.01) |
| *H04B 1/00* | (2006.01) |
| *H03D 3/00* | (2006.01) |

(52) U.S. Cl.
CPC .......... *H03M 1/66* (2013.01); *G05B 19/042* (2013.01); *H03H 17/08* (2013.01); *H03M 1/0614* (2013.01); *H03D 3/00* (2013.01); *H03M 1/12* (2013.01); *H03M 2201/12* (2013.01); *H04B 1/0003* (2013.01)

(58) Field of Classification Search
CPC .......... H03M 1/66; H03D 3/00; H04B 1/0003
USPC .............. 341/144; 375/324, 316; 702/99, 57
See application file for complete search history.

(56) References Cited

U.S. PATENT DOCUMENTS

2008/0099042 A1\* 5/2008 Byrne .................. B60S 1/0822
134/6

\* cited by examiner

*Primary Examiner* — Joseph J Lauture
(74) *Attorney, Agent, or Firm* — North Weber & Baugh LLP

(57) ABSTRACT

Various embodiments of the invention relate to a high accuracy phase shift apparatus. The phase shift apparatus comprises a voltage controlled analog phase shifter, a microcontroller unit (MCU) and a digital-to-analog converter (DAC). The MCU generates a digital control signal, which is converted into an analog control signal by the DAC to control the voltage controlled analog phase shifter to achieve desired phase shift angle. The phase shift apparatus may further incorporate a temperature sensor for temperature compensation. The output from the temperature sensor may be used to modify the reference voltage of the DAC, or alternatively be used to modify the digital control signal from the MCU. By incorporation digitalized control and temperature compensation to an analog phase shifter, the disclosed phase shift apparatus achieves high accuracy digitalized control, a flat phase shift over a wide bandwidth, and a stable phase shift over temperature variation.

20 Claims, 13 Drawing Sheets

HIGH ACCURACY PHASE SHIFT APPARATUS

CROSS-REFERENCE TO RELATED APPLICATIONS

This application claims foreign priority to Chinese Patent Application No. 201810388855.4, entitled "A HIGH ACCURACY PHASE SHIFT APPARATUS", naming Cemin Zhang as inventor, and filed Apr. 27, 2018, the subject matter of which is hereby incorporated herein by reference.

BACKGROUND

A. Technical Field

The present invention relates generally to a phase shift apparatus, and more particularly to a high accuracy phase shift apparatus.

B. Background of the Invention

A phase shifter is a microwave network module which provides a controllable phase shift of the radio frequency (RF) signal. Phase shifters have been used widely in applications, such as satellite communications, automotive radar, 5G cellular communications, imaging and sensing, etc. It is desired that a phase shifter has an ability of a flat phase shift over a wide bandwidth, low insertion loss, high resolution (e.g. less than 2 degree LSB), stable phase shift over temperature variation, monotonic phase response, only requiring positive voltage etc.

Phase shifters may be classified as analog phase shifters and digital phase shifters. Analog phase shifters provide a continuously variable phase shift or time delay, while digital phase shifters provide a discrete set of phase shifts or time delays. Both analog phase shifters and digital phase shifters have respective advantages and disadvantages. Analog phase shifters may have the benefit of low insertion loss, flat phase response over wide frequency range with monotonic continuous tuning, and only require a single positive control voltage, but they tend to have some phase variation over temperature. Traditional digital phase shifters (DPS) generally have higher insertion loss associated with high resolution. Furthermore, DPS with higher number of bit tends to have limited bandwidth and suffer monotonic error at certain frequencies and phase states. For MMIC DPS using PHEMT technology, it requires negative voltage for controlling or biasing, which adds more complexity for controlling circuit.

Accordingly, there is a need for a high accuracy phase shift apparatus that may utilize the advantages of both analog phase shifters and digital shifters and overcome the respective disadvantages.

SUMMARY OF THE INVENTION

The invention relates to a high accuracy phase shift apparatus that may utilize advantages of both analog phase shifters and digital shifters without respective disadvantages.

In some embodiments, this invention features a high accuracy phase shift apparatus comprising a voltage controlled analog phase shifter, a microcontroller unit (MCU), a digital-to-analog converter (DAC). The analog phase shifter receives an RF input signal and outputs an RF output signal, which has a phase shift with reference to the RF input signal controlled by a voltage level of a control signal. The MCU generates a digital control signal, which is converted into a voltage control signal by the DAC to control the analog phase shifter to achieve a desired phase shift angle.

In some embodiments, the DAC receives a reference voltage. The voltage level of the reference voltage determines the full scale DAC analog output, which corresponds to the maximum phase shift (e.g. 360 degree or more) of the analog phase shifter (APS). The digital control signal output from the MCU is converted by the DAC into the voltage control signal with voltage level fractional to the reference voltage. The fraction is determined by the numerical value of the digital control signal, which may comprise multiple binary bits. The resolution of the phase shift (step size for phase shift) is determined by the maximum phase shift divided by the maximum numerical value of the digital control. For example, with a 360 degree maximum phase shift angle, the resolution of phase shift for an 8-bit digital control signal will be $360/2^8=1.4$ degree.

In some embodiments, the MCU incorporates a memory storing a lookup table that corresponds each phase shift value of interest (e.g., 0 to 360 degree, 2 degree per step) to a specific state of the digital control signal. The lookup table may be created during the test stage of the phase shift apparatus and pre-loaded to the memory. When a desired phase shift (e.g. 180 degree) is required, the MCU retrieves a corresponding state for the digital control signal from the lookup table and send the digital control signal with the retrieved corresponding state to DAC to generate a desired control signal, which is received by the APS to generate the desired phase shift.

In some embodiments, the phase shift apparatus may further incorporate a temperature sensor for temperature compensation. The output from the temperature sensor may be used to modify the reference voltage of the DAC, or alternatively be used to modify the digital control signal from the MCU. By incorporation digitalized control and temperature compensation to an analog phase shifter, the disclosed phase shift apparatus achieves high accuracy digitalized control, a flat phase shift over a wide bandwidth, and a stable phase shift over temperature variation.

In some embodiments, the MCU may be replaced by other type of controlling unit such as a Field-Programmable Gate Array (FPGA) or a Digital Signal Processor (DSP).

Compared to prior phase shift techniques, the invented phase shift apparatus features the following benefits: high digitized resolution, flat phase shift over a wide bandwidth, and stable phase shift over temperature variation etc.

BRIEF DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

Figure ("FIG.") 1 depicts a prior art five bit digital phase shifter with an 11.25 degree least significant bit.

One skilled in the art will recognize that various implementations and embodiments of the invention may be practiced in accordance with the specification. All of these implementations and embodiments are intended to be included within the scope of the invention.

DETAILED DESCRIPTION OF THE PREFERRED EMBODIMENTS

In the following description, for purpose of explanation, specific details are set forth in order to provide an understanding of the present invention. The present invention may, however, be practiced without some or all of these details. The embodiments of the present invention described below may be incorporated into a number of different electrical components, circuits, devices, and systems. Structures and devices shown in block diagram are illustrative of exemplary embodiments of the present invention and are not to be used as a pretext by which to obscure broad teachings of the present invention. Connections between components within the figures are not intended to be limited to direct connections. Rather, connections between components may be modified, re-formatted, or otherwise changed by intermediary components.

When the specification makes reference to "one embodiment" or to "an embodiment" it is intended mean that a particular feature, structure, characteristic, or function described in connection with the embodiment being discussed is included in at least one contemplated embodiment of the present invention. Thus, the appearance of the phrase, "in one embodiment," in different places in the specification does not constitute a plurality of references to a single embodiment of the present invention.

Figure 1:
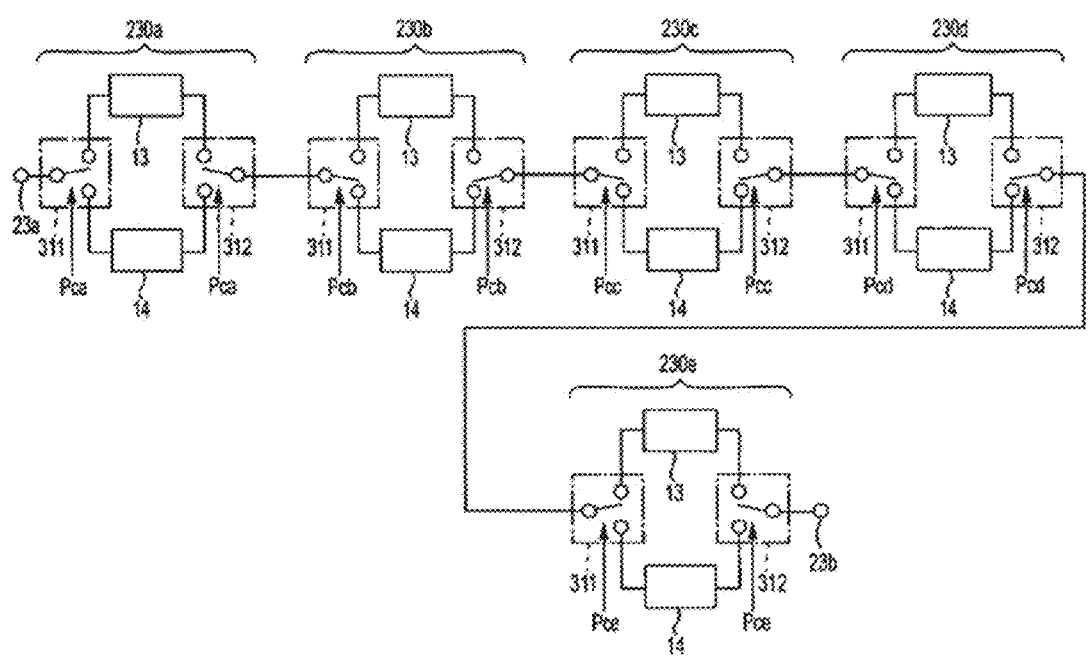

FIG. 1 depicts a prior art five bit digital phase shifter with an 11.25 degree least significant bit. The phase shifter, disclosed in U.S. Pat. No. 6,806,792, has input and output terminals 23a and 23b, respectively. The digital phase shifter comprises five switched-line phase shifters 230a, 230b, 230c, 230d, and 230e, all of which provide different phase shifts. The phase shift is defined as the difference in phase between signals at the phase shifter output and input. In the digital phase shifter so constructed, the phase of RF signal input can be varied in steps of 11.25° in the range of from 11.25° to 348.75° using a 5-bit control signal. To achieve a higher resolution of phase control (smaller step), a digital phase shifter will need to incorporate more switched-line phase shifters such that a higher bit control signal may be used. However, higher numbers of cascaded switched-line phase shifters typically adds more insertion loss, tends to have limited bandwidth, and suffers monotonic error at certain frequencies.

Figure 2:
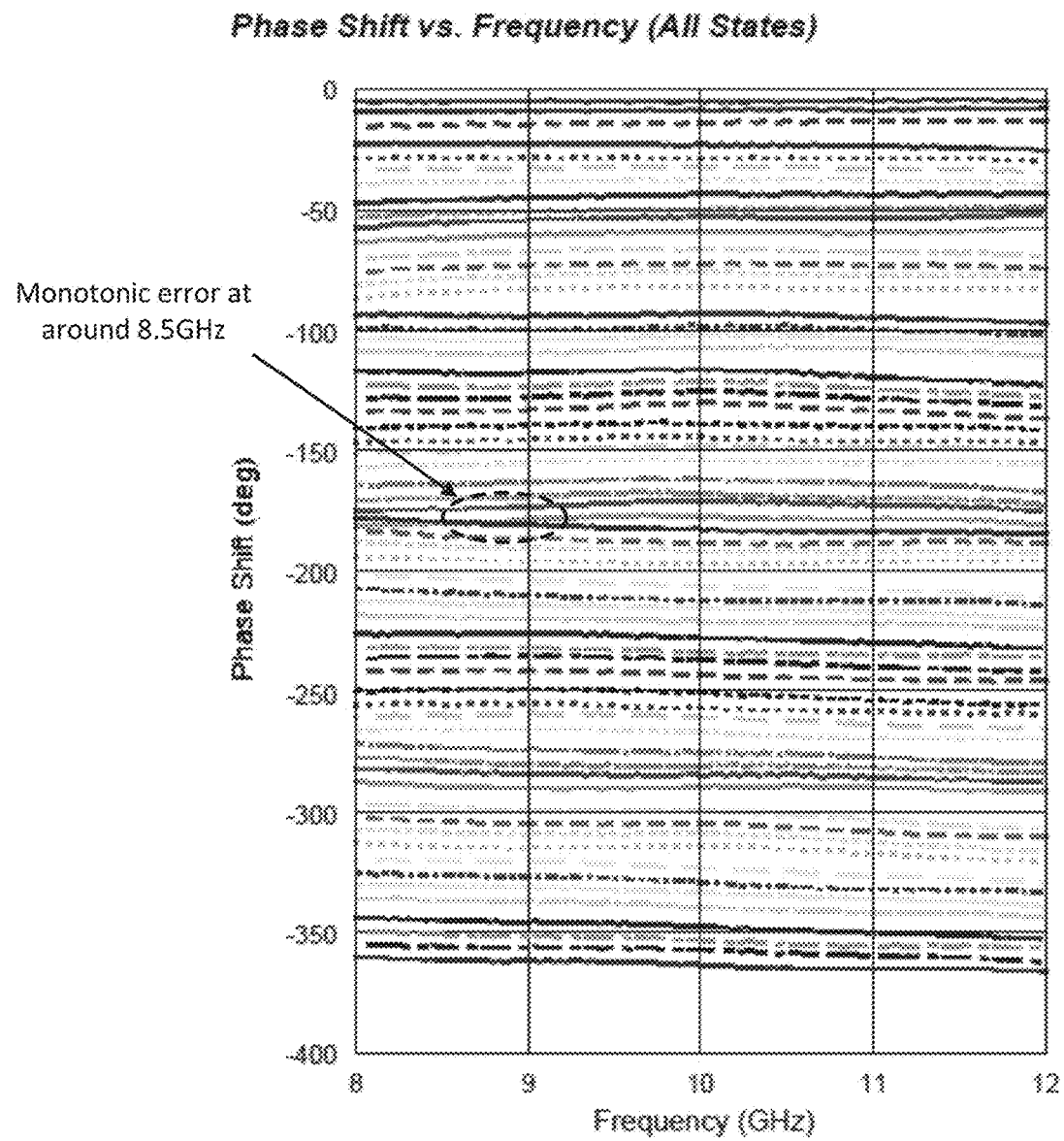
FIG. 2 depicts a typical monotonic error associated with a digital phase shifter.

FIG. 2 depicts a typical monotonic error associated with a digital phase shifter (DPS) with 6-bit control signal. The monotonic error is shown in a plot of phase shift vs. Frequency (all states) for a commercially available DPS MAPS-010166. For a DPS, when the control signal of DPS increases or decreases, the phase shift is expected to monotonically follow the control signal change. However, at certain states of the control signal, the actual phase shift of a DPS may suddenly deviate the monotonic pattern and change in an opposite way from expected direction. Such a deviation is referred as monotonic error. As shown in FIG. 2, the DPS shows monotonic error at around 8.5 GHz.

Besides the aforementioned monotonic error and insertion loss, other disadvantages may limit the application of traditional DPS. For example, Monolithic Microwave Integrated Circuit (MMIC) DPS using High-electron-mobility transistor (HEMT) technology requires negative voltage for controlling or biasing, which causes additional complexity for controlling circuit and thus limits its applicability.

Figure 3:
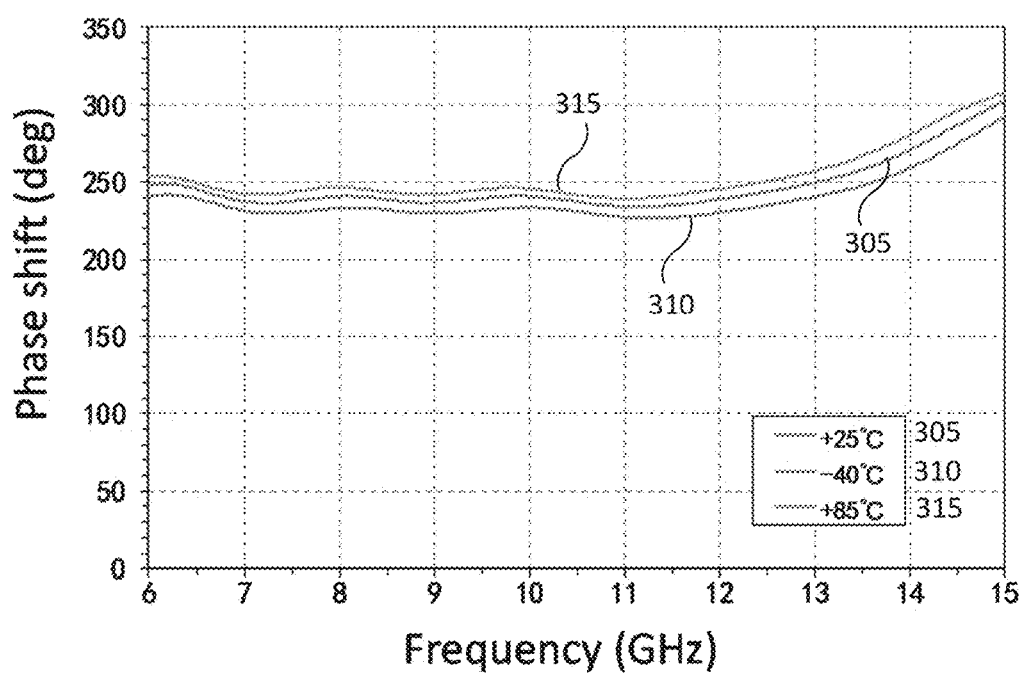
FIG. 3 depicts a phase shift variation over temperature of a wideband analog phase shifter.

Compared to DPS, analog phase shifter (APS) has the benefit of low insertion loss, flat phase response over wide frequency range with monotonic continuous tuning, and only require a single positive control voltage. However, APS tends to have some phase variation over temperature. FIG. 3 depicts a phase shift variation over temperature of a voltage controlled wideband analog phase shifter. As shown in FIG. 3, the phase shift curves 305, 310, and 315, which correspond to operation temperature at +25° C., −40° C. and +85° C., vary from each other. Such a temperature variation needs to be addressed properly for a high accuracy phase shift control.

To address the respective disadvantages for APS and DPS, the disclosed invention discloses a high accuracy phase shift apparatus that may utilize advantages of both analog phase shifters and digital shifters.

Embodiment 1

Figure 4:
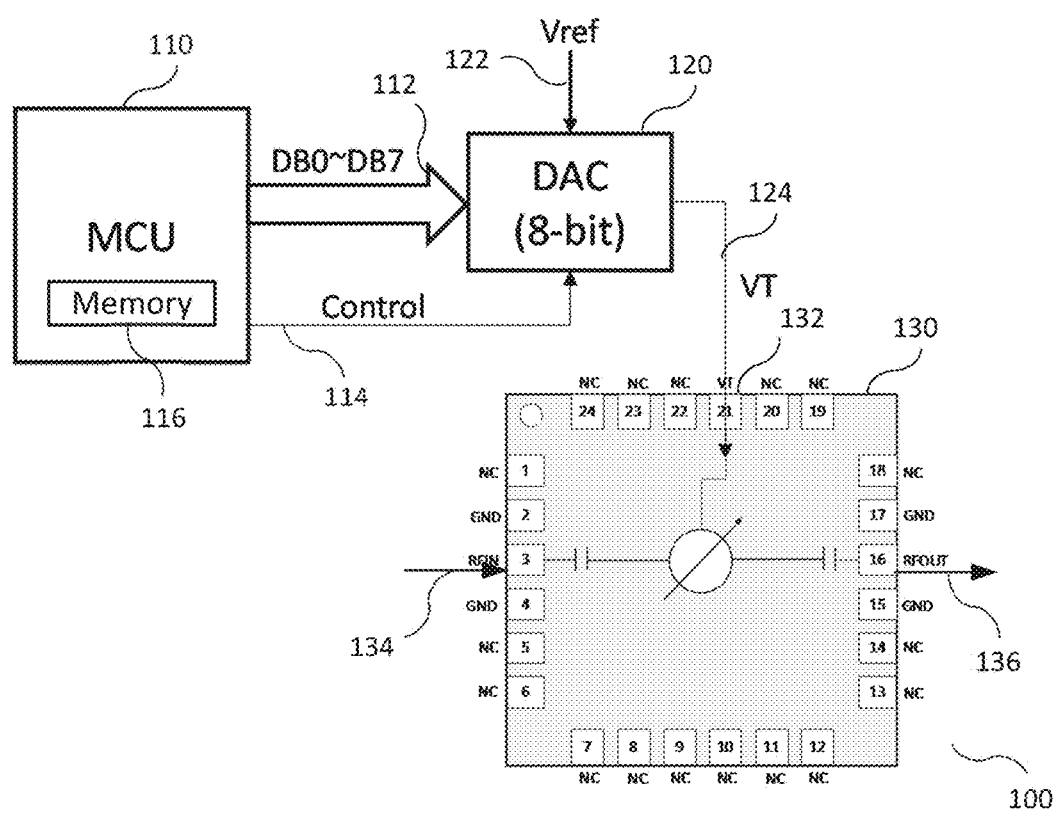
FIG. 4 depicts a block diagram of a phase shift apparatus according to a first embodiment of the invention.

FIG. 4 depicts a block diagram of a phase shift apparatus 100 according to one embodiment of the invention. The phase shift apparatus 100 comprising a microcontroller unit (MCU) 110, a digital-to-analog converter (DAC) 120, and a voltage controlled analog phase shifter (APS) 130. The MCU 110 generates a digital control signal 112, which is converted into a control voltage 124 by the DAC 120 to control the APS to achieve a desired phase shift angle. The APS 130 receives an RF input signal 134 and outputs an RF output signal 136, which has the desired phase shift with reference to the RF input signal. The MCU 110 may also output a control signal 114 to enable/disable the DAC 120.

In this embodiment, the DAC 120 receives a reference voltage 122. The voltage level of the reference voltage determines the full scale DAC analog output, which corresponds to the maximum phase shift (e.g. 360 degree or more) of the analog phase shifter (APS). The digital control signal output 112 from the MCU is converted by the DAC into the control voltage 124 with voltage level fractional to the reference voltage. The fraction is determined by the numerical value of the digital control signal, which may comprise multiple binary bits, e.g. 8-bits comprising DB0~DB7 as shown in FIG. 4. The resolution of the phase shift (step size for phase shift control) is determined by the maximum phase shift divided by the maximum numerical value of the digital control signal. For example, with a 360 degree maximum phase shift angle, the precision of phase control for an 8-bit control signal will be $360/2^8=1.4$ degree.

Embodiment 2

In another embodiment, further improvements of the phase shift apparatus have been made based on embodiment 1.

In some embodiments, the MCU 110 incorporates a memory 116 storing a lookup table that corresponds each of a phase shift value of interests (e.g., 0 to 360 degree, 2 degree per step) with one specific state of the digital control signal. The lookup table may be created during a test stage of the phase shift apparatus and pre-loaded to the memory. The test stage may comprise tests performed at various control voltages under one or more frequencies and/or under one or more temperatures. Tab. 1 below shows an exemplary look-up table with selected entries for an 8-bit digital control signal. When a desired phase shift (e.g. 180 degree) is required, the MCU retrieves a corresponding state for the digital control signal from the lookup table and send the digital control signal with the retrieved corresponding state to DAC to generate a desired voltage control signal 124, which is received by the APS to generate the desired phase shift. In embodiments, the memory 116 may be an external memory but accessible by the MCU 110 for data retrieval.

TABLE 1

Lookup table corresponding phase shifts with digital control signal states

| Digital control signal states | | DAC Output |
|---|---|---|
| MSB | LSB | |
| 1111 | 1111 | $+V_{REF}\left(\frac{255}{256}\right)$ |
| 1000 | 0001 | $+V_{REF}\left(\frac{129}{256}\right)$ |
| 1000 | 0000 | $+V_{REF}\left(\frac{128}{256}\right)$ |
| 0111 | 1111 | $+V_{REF}\left(\frac{127}{256}\right)$ |
| 0000 | 0001 | $+V_{REF}\left(\frac{1}{256}\right)$ |
| 0000 | 0000 | 0 V |

Note:
$LSB = (V_{REF})(2^{-8}) = \frac{V_{REF}}{256}$

Figure 5:
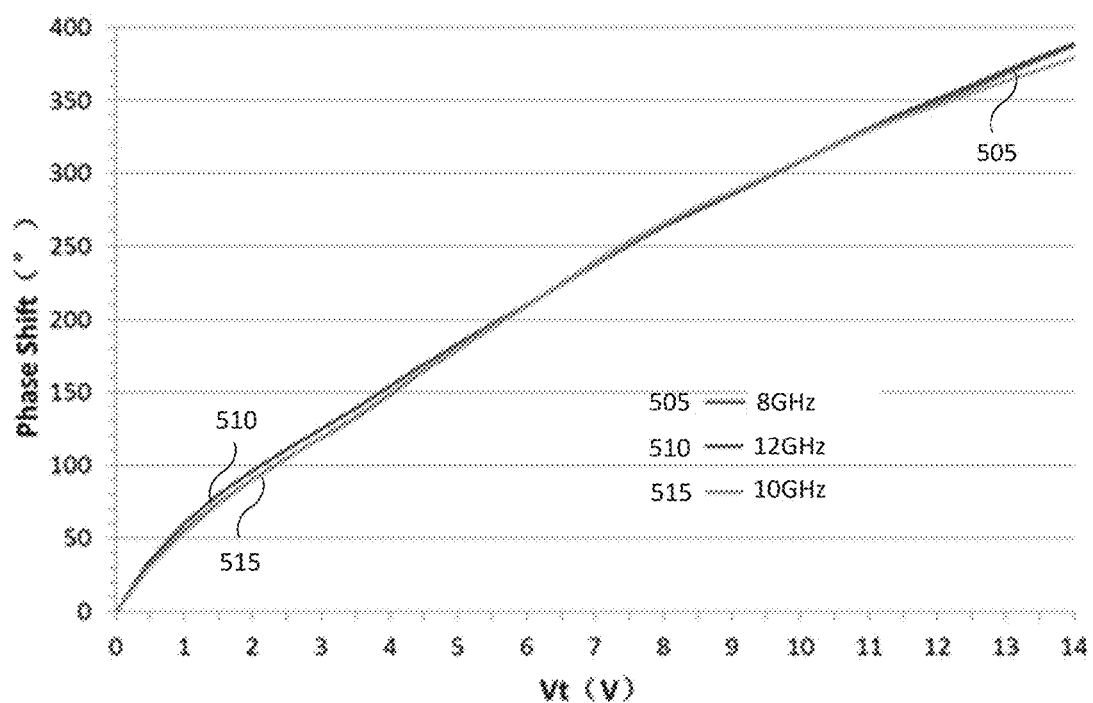
FIG. 5 depicts a phase shift of the phase shift apparatus under different control voltage according to a second embodiment of the invention.

In the embodiments, the APS 130 may not have phase shift perfectly linear to the voltage level of the voltage control signal 124. FIG. 5 depicts a phase shift of the phase shift apparatus under different control voltage according to the embodiment. FIG. 5 comprises phase shift curves 505, 510 and 515 at different control signal voltage at 8 GHz, 12 GHz, and 10 GHz respectively. All the phase shift curves are obtained tested under 25° C. and have at least some non-linear portions. With the test data shown in FIG. 5, a lookup table may be created during the test stage of the phase shift apparatus and pre-loaded to the memory. Using the lookup table to retrieve a desired state of the digital control signal corresponding to a desired phase shift may establish a straightforward linear control for the phase shift control. For example, to achieve a phase control between 0 and 360 degree with 2 degree step size, a digital control signal with at least 180 states will be needed. Therefore, the digital control signal will need at least 8 bits (corresponding to $2^8=256$ available states) to meet the requirement of at least 180 states. By relating 180 states selected from the 256 available states to the 180 phase shift angles respectively, a precise lookup table can be created for linear control of the phase shift. The selected 180 states from the total 256 available states may not be distributed linearly or evenly, due to the aforementioned non-linear portion of the actual phase shift curves. If the state of the digital control signal is adjusted linearly without the lookup table, the actual phase shift will not be controlled linearly.

Figure 6:
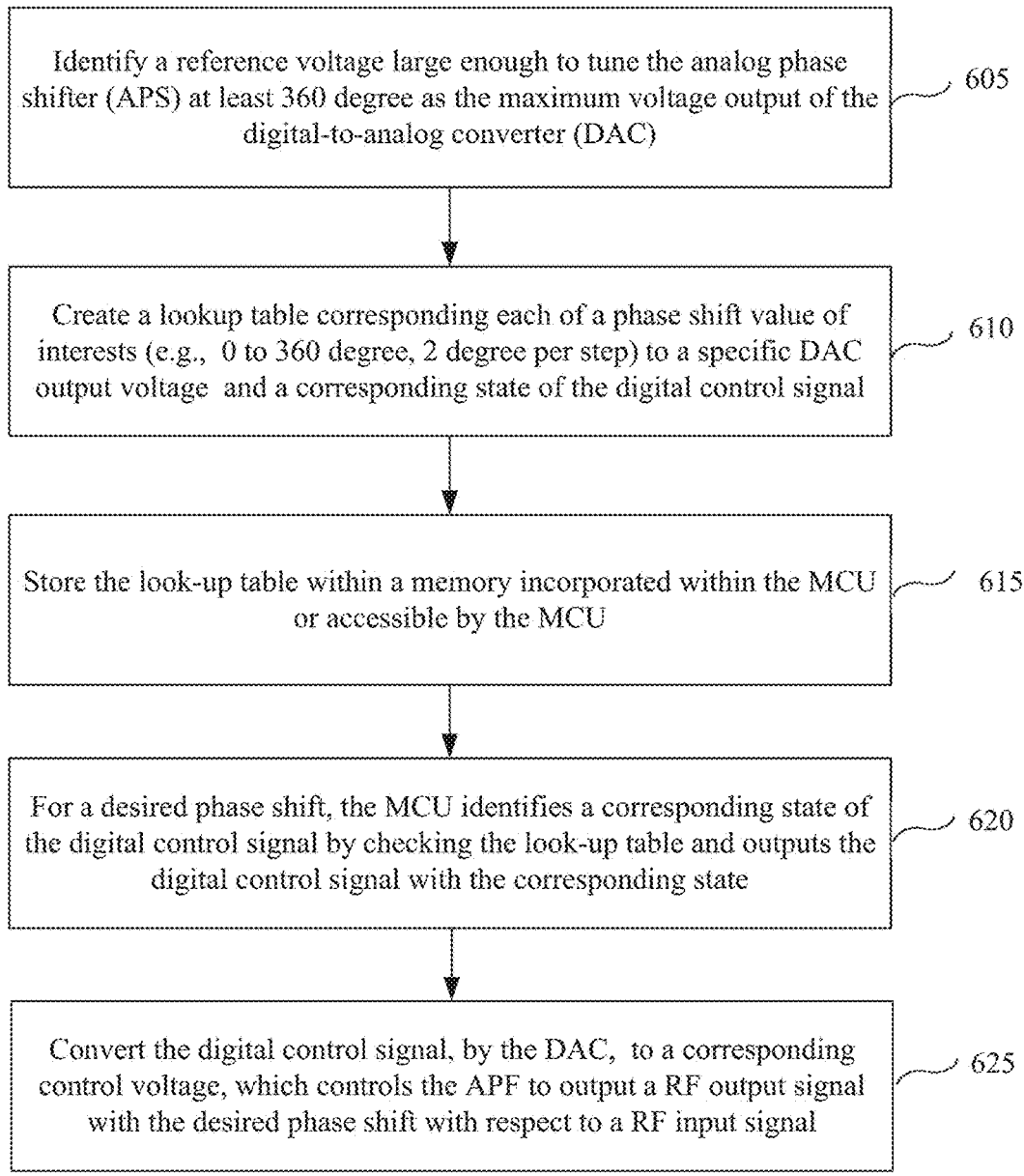
FIG. 6 depicts an operation process of a phase shift apparatus according to the second embodiment of the invention.

FIG. 6 depicts an operation process of a phase shift apparatus according to the embodiment. In step 605, a reference voltage large enough to tune the analog phase shifter (APS) at least 360 degree is identified as the maximum voltage output of the digital-to-analog converter (DAC). In step 610, a lookup table is created to correspond each of a phase shift value of interests (e.g., 0 to 360 degree, 2 degree per step) with a specific DAC output voltage (among a plurality of DAC output voltages) and a corresponding state of the digital control signal. In step 615, the look-up table is stored within a memory incorporated within the MCU or accessible by the MCU. In step 620, the MCU identifies a corresponding state of the digital control signal for a desired phase shift, by checking the look-up table and outputs the digital control signal with the corresponding state. In step 625, the digital control signal is converted by the DAC to a corresponding control voltage, which controls the APS to output an RF output signal with the desired phase shift with respect to an RF input signal.

Embodiment 3

Figure 7:
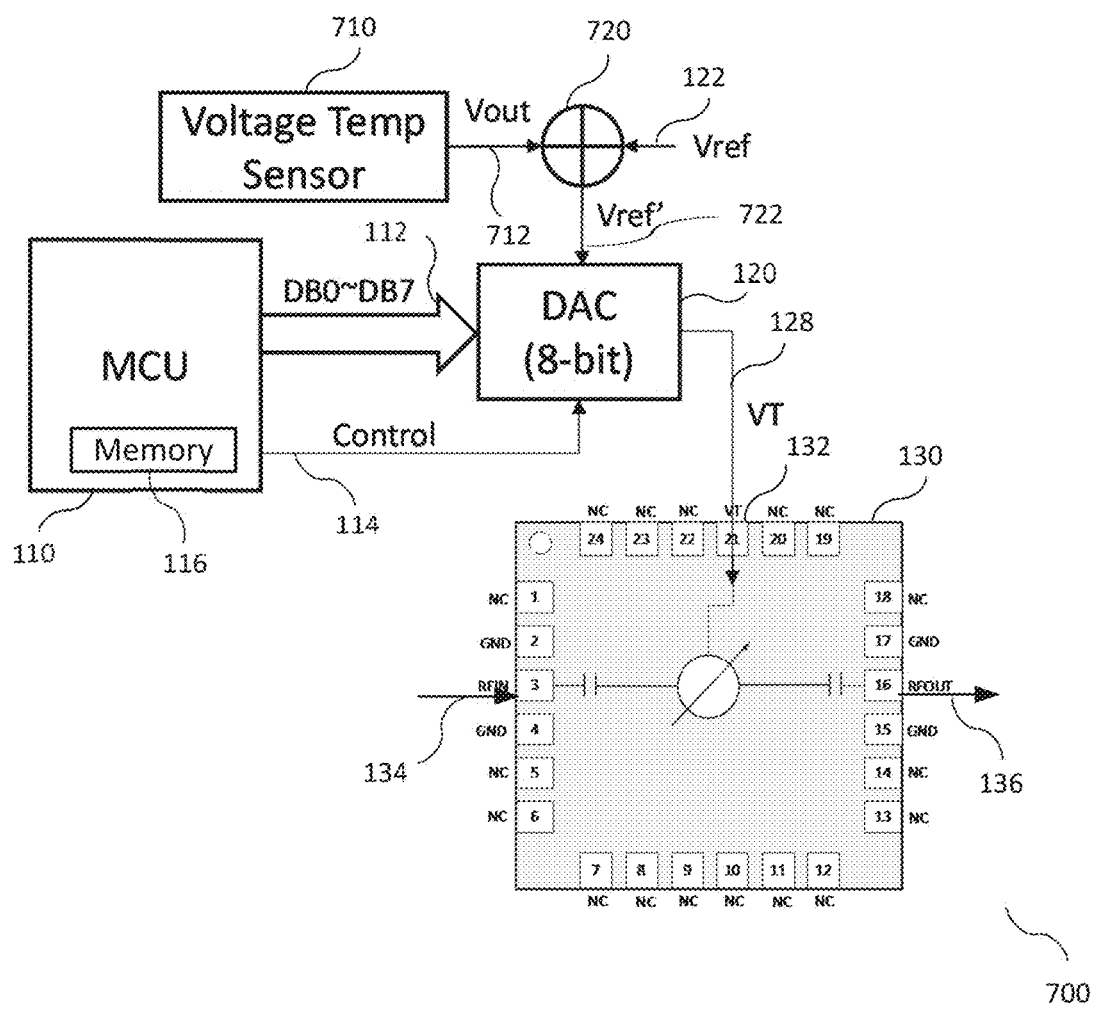
FIG. 7 depicts a block diagram of a phase shift apparatus with temperature compensation according to a third embodiment of the invention.

Based on embodiment 1 or embodiment 2, in some embodiments, the phase shift apparatus may further incorporate a temperature sensor for temperature compensation. FIG. 7 depicts a block diagram of a phase shift apparatus 700 with temperature compensation according to various embodiment of the invention. Compared to the phase shift apparatus 100 shown in FIG. 1, the phase shift apparatus 700 further incorporates a temperature sensor 710 and a mixer 720. The temperature sensor 710 senses ambient temperature and outputs an output voltage $V_{OUT}$ 712 representing ambient temperature. The mixer 720 receives the output voltage $V_{OUT}$ 712 and the reference voltage $V_{REF}$ 122 to output a modified reference voltage $V_{REF'}$ 722. The DAC 120 outputs a temperature compensated control voltage VT 128 based on the digital control signal 112 and the modified reference voltage $V_{REF'}$ 722.

Figure 8:
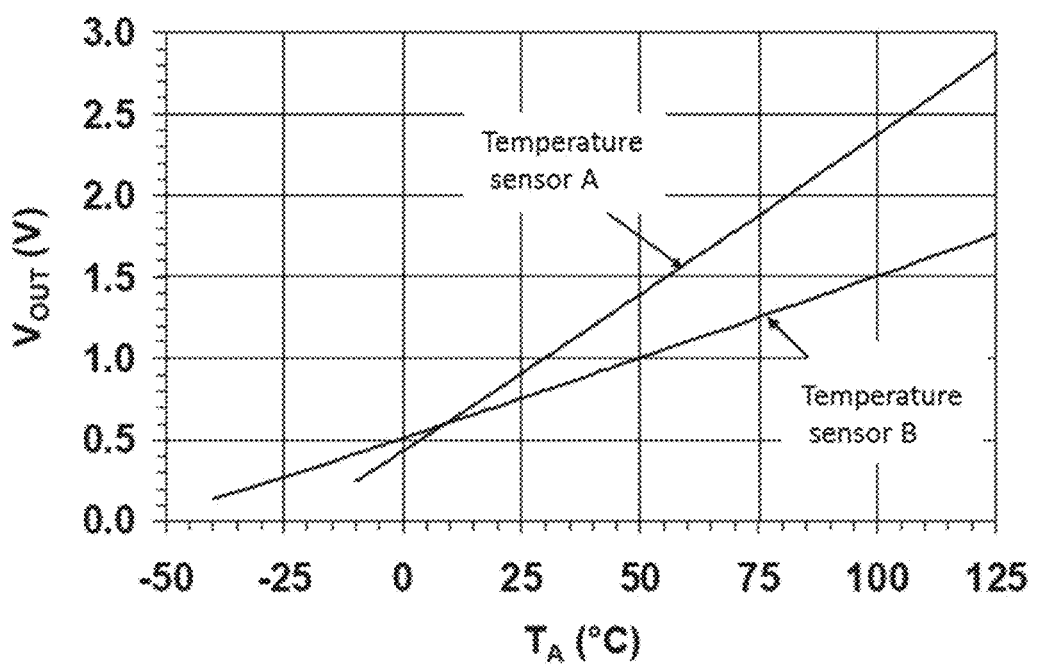
FIG. 8 depicts an output voltage under different temperature for a temperature sensor according to the third embodiment of the invention.
Figure 9:
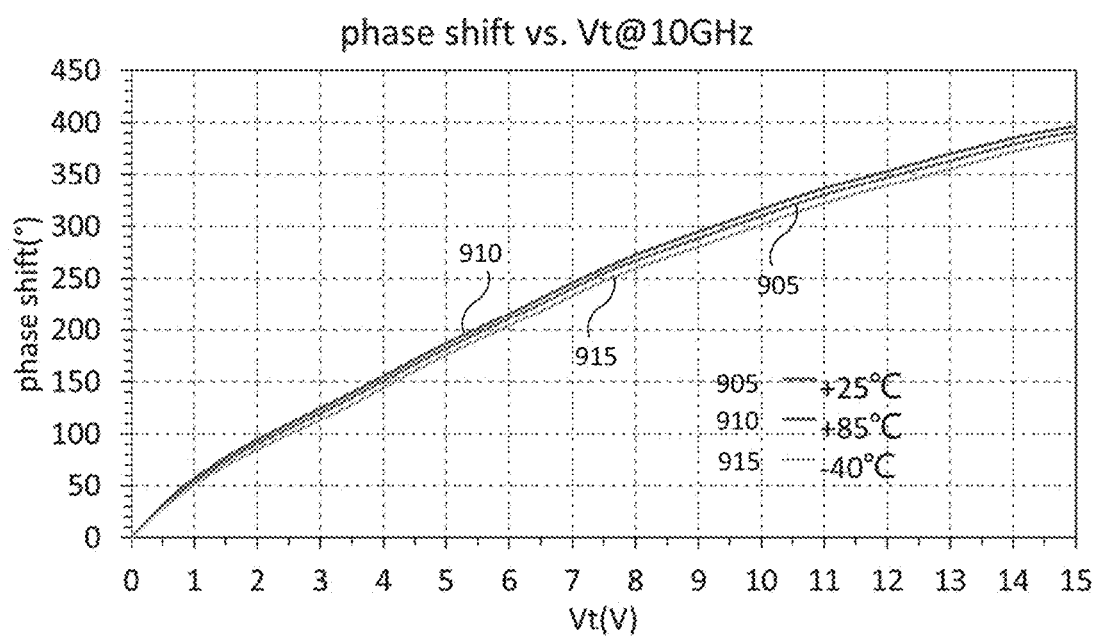
FIG. 9 depicts a phase shift of an analog phase shifter under different control voltage and various temperatures according to the third embodiment of the invention.

FIG. 8 depicts an output voltage under different temperature for a temperature sensor according to the embodiment. FIG. 9 depicts a phase shift of an analog phase shifter (APS) under different control voltage and various temperatures according to the embodiment. FIG. 9 comprises phase shift curves 905, 910 and 915 at different control signal voltage obtained at 10 GHz under temperature of +25° C., +85° C. and −40° C. respectively. It can be seen from FIG. 9 that the APS tested has a higher phase shift angle at higher temperature under the same control voltage. Therefore, for a phase shift apparatus to output an actual phase shift as desired, such a temperature variation needs to be addressed.

In the embodiment, the mixer 720 adds or subtracts the output voltage $V_{OUT}$ 712 from the reference voltage $V_{REF}$122 to generate the modified reference voltage $V_{REF'}$ 722. The addition or subtraction may be a weighted operation, as shown in equation (1) below:

$$V_{REF'} = V_{REF} + K \times V_{OUT} \tag{1}$$

Wherein K is an amplification coefficient to ensure accuracy of $V_{REF'}$ for minimized temperature variation. K can be a positive or negative value, depending on voltage-temperature characteristics of the temperature sensor and the temperature variation of the APS. For example, for a positive voltage-temperature characteristics (e.g. high output voltage under high temperature) and a positive temperature variation (e.g. higher phase shift under higher temperature) of the APS, the amplification coefficient K needs to be a negative value to obtain a modified reference voltage $V_{REF'}$ lower than the reference voltage $V_{REF}$, such that the temperature compensated control voltage 128 may be lowered under higher temperature to offset the temperature variation effect.

Figure 10:
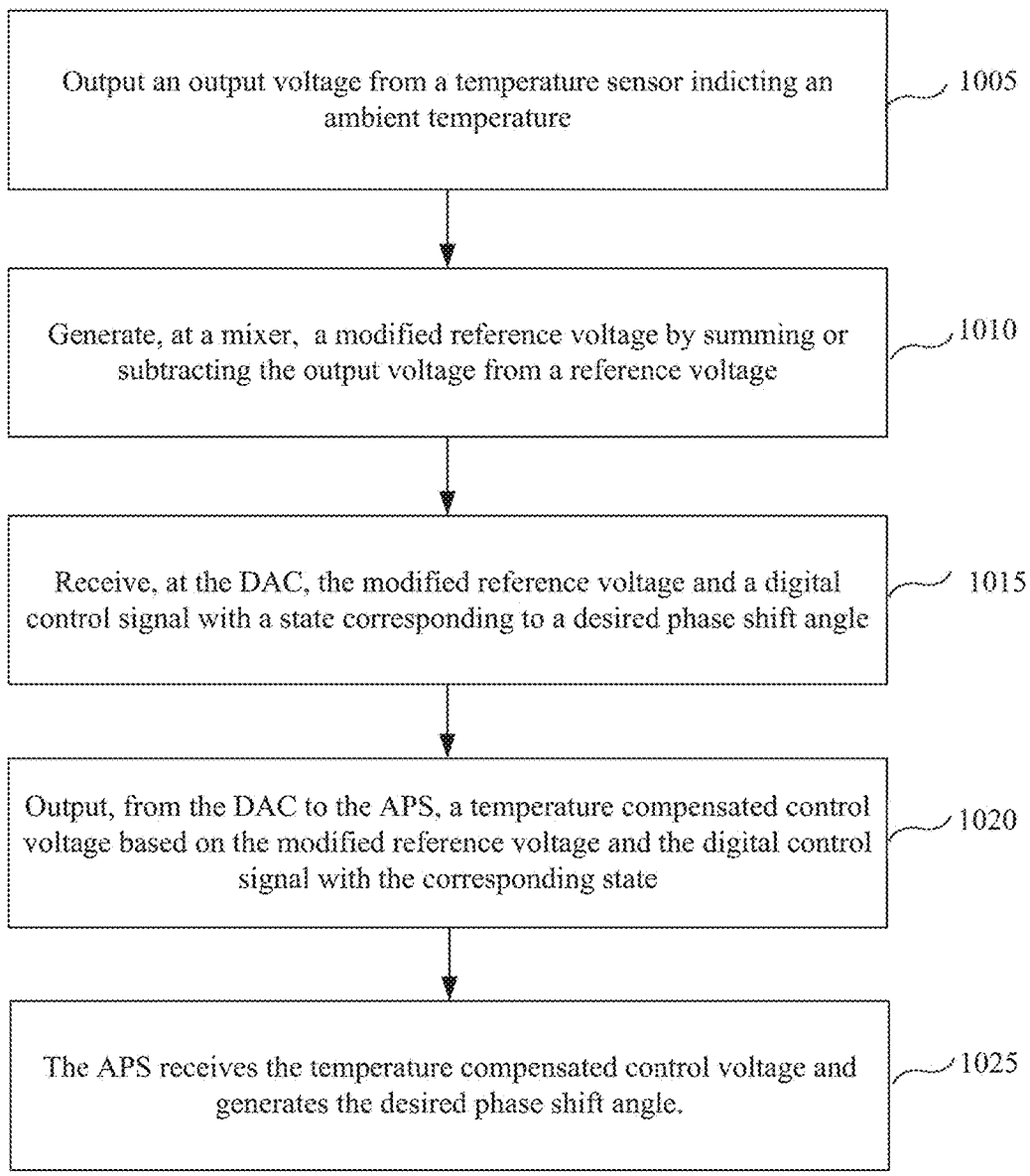
FIG. 10 depicts an operation process of a phase shift apparatus with temperature compensation according to the third embodiment of the invention.

FIG. 10 depicts an operation process of a phase shift apparatus with temperature compensation according to the embodiment. In step 1005, a temperature sensor outputs an output voltage indicting an ambient temperature. In step 1010, a mixer generates a modified reference voltage by summing or subtracting the output voltage from a reference voltage. The reference voltage may be identified using the same process as disclosed in step 605 shown in FIG. 6. In step 1015, the DAC receives the modified reference voltage and a digital control signal with a state corresponding to a desired phase shift angle. The corresponding state of the digital control signal may output from the MCU using the same process as disclosed in steps 610-620 shown in FIG. 6. In step 1020, the DAC output a temperature compensated control voltage to the APS based on the modified reference voltage and the digital control signal with the corresponding state. In step 1025, the APS receives the temperature compensated control voltage and generates the desired phase shift angle.

Embodiment 4

Figure 11:
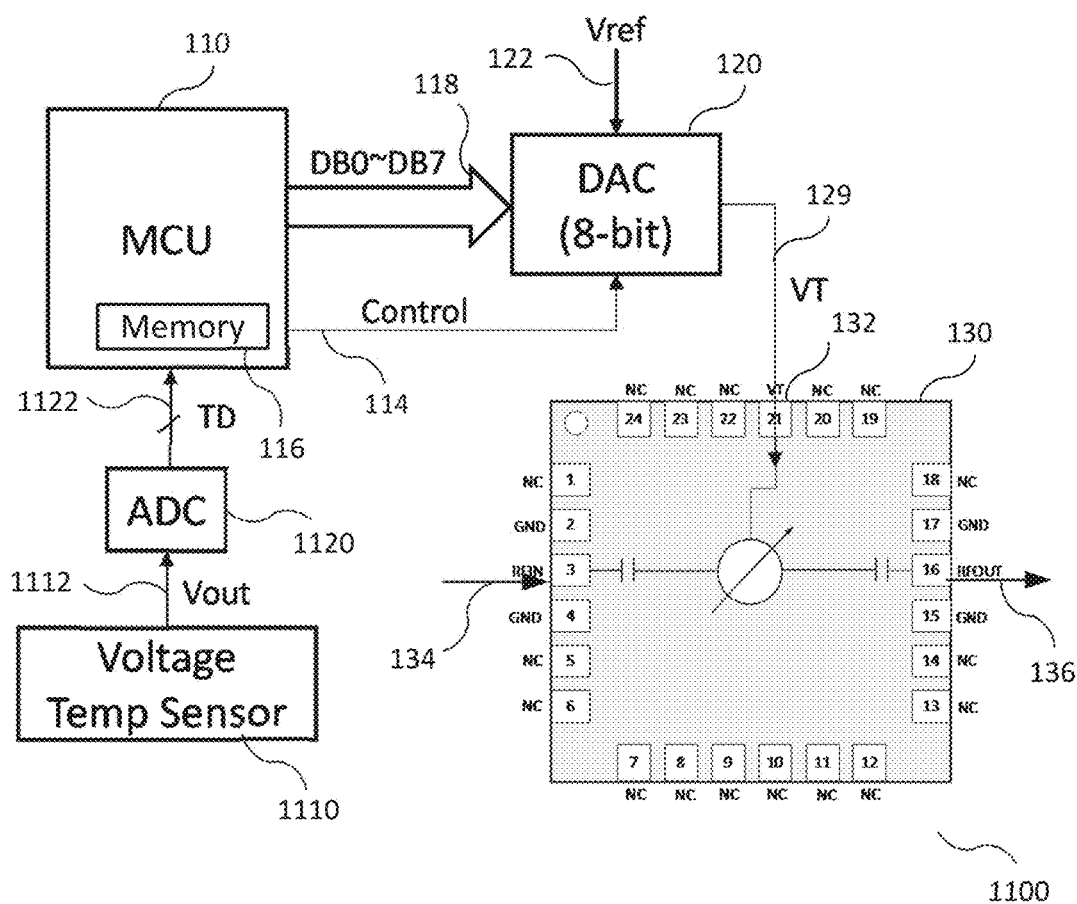
FIG. 11 depicts a block diagram of an alternative phase shift apparatus with temperature compensation according to a fourth embodiment of the invention.

FIG. 11 depicts a block diagram of an alternative phase shift apparatus 1100 with temperature compensation according to the embodiment. The phase shift apparatus 1100 incorporates a temperature sensor 1110 and an analog-to-digital converter (ADC) 1120. The temperature sensor 1110 senses ambient temperature and outputs an output voltage $V_{OUT}$ 1112 representing ambient temperature. The ADC 1120 receives the output voltage $V_{OUT}$ 1112 and output a digital temperature signal TD 1122. The MCU 110 receives digital temperature signal TD 1122 and outputs an adjusted digital control signal 118. The DAC 120 receives the temperature compensated digital control signal 118 and the reference voltage 122, and output a temperature compensated control voltage VT 129 to control the APS to achieve a desired phase shift angle. The APS 130 receives an RF input signal 134 via an input port RFIN and outputs, via an output port RFOUT, an RF output signal 136, which has the desired phase shift with reference to the RF input signal. In embodiments, the RF input port and RF output port of APS are interchangeable (i.e. the APS 130 is bi-directional).

Figure 12:
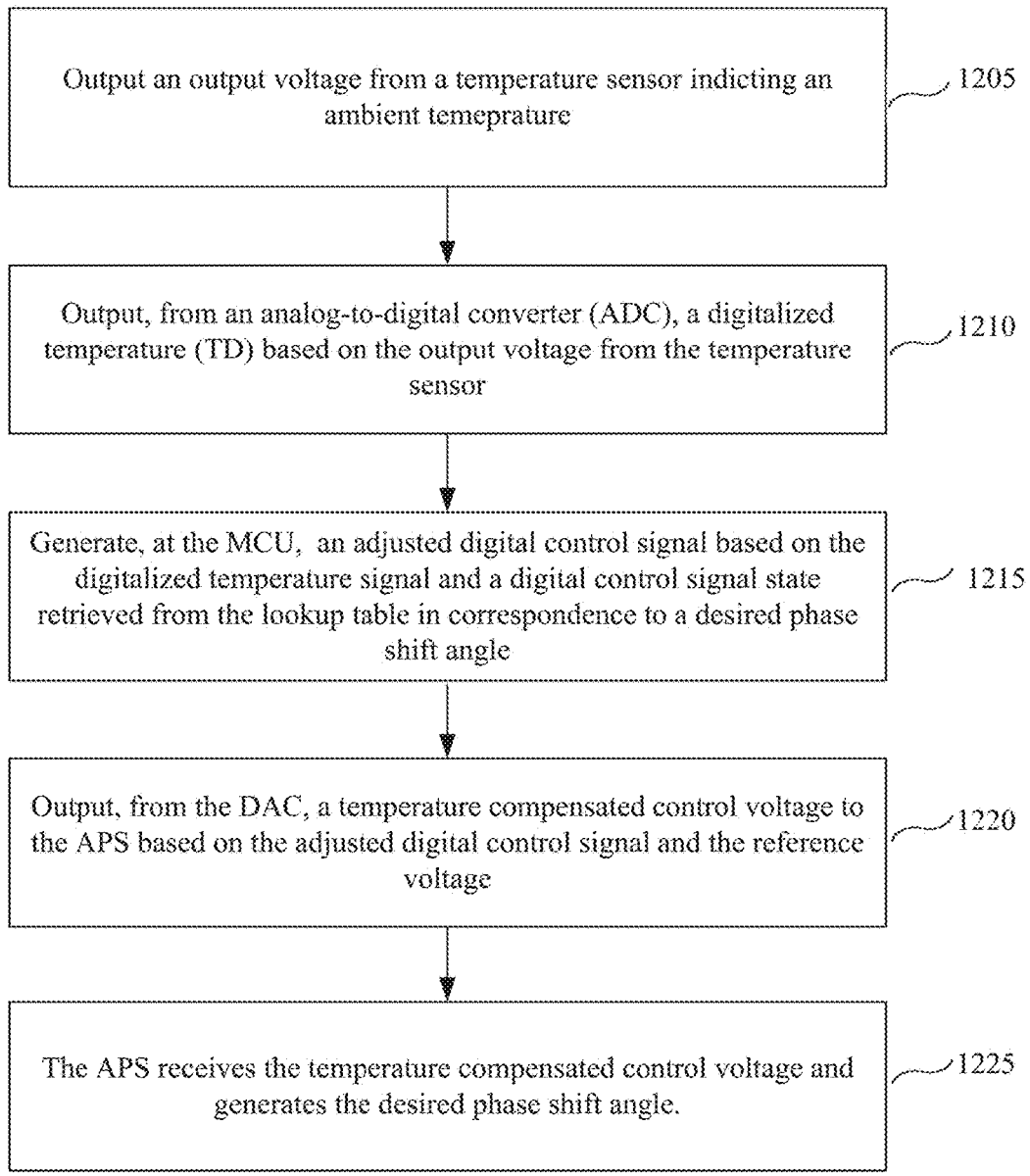
FIG. 12 depicts an operation process of the alternative phase shift apparatus with temperature compensation according to the fourth embodiment of the invention.

FIG. 12 depicts an operation process of the alternative phase shift apparatus 1100 with temperature compensation according to the embodiment. In step 1205, a temperature sensor outputs an output voltage $V_{OUT}$ indicting an ambient temperature. In step 1210, the ADC receives the output voltage $V_{OUT}$ and output a digitalized temperature signal TD. In step 1215, the MCU generates an adjusted digital control signal based on the digitalized temperature signal TD and a digital control signal state retrieved from the lookup table in correspondence to a desired phase shift angle. In step 1220, the DAC output a temperature compensated control voltage to the APS based on the adjusted digital control signal and the reference voltage. The reference voltage may be identified using the same process as disclosed in step 605 shown in FIG. 6. In step 1225, the APS receives the temperature compensated control voltage and generates the desired phase shift angle.

Embodiment 5

Figure 13:
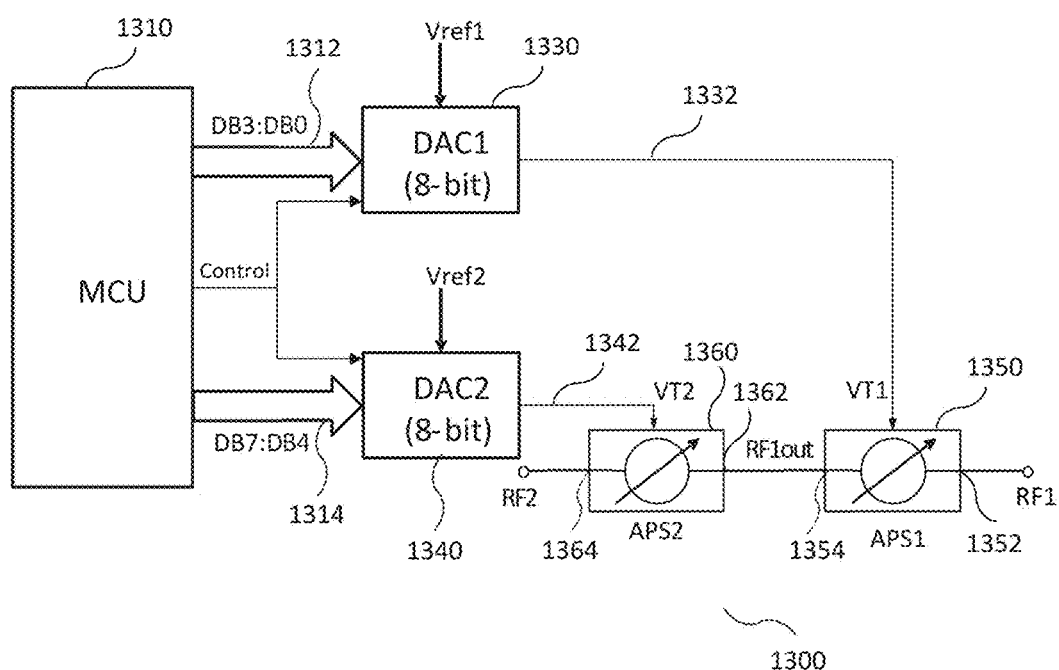
FIG. 13 depicts a block diagram of an alternative phase shift apparatus with coarse/fine tuning capability according to a fifth embodiment of the invention.

FIG. 13 depicts a block diagram of an alternative phase shift apparatus 1300 with coarse/fine tuning capability according to the embodiment. The phase shift apparatus 1300 comprises an MCU 1310, which couples to more than one DAC, e.g. the first DAC 1330 and the second DAC 1340. In embodiments, the MCU 1310 outputs a multi-bits digital control signal divided into a first group 1312 and a second group 1314 coupled to the first DAC 1330 and the second DAC 1340 respectively. The first group 1312 may be the least significant bits (LSBs) of the digital control signal, e.g. DB0~DB3 of an 8-bit digital control signal. The second group 1314 may be the most significant bits (MSBs) of the digital control signal, e.g. DB4~DB7 of an 8-bit digital control signal.

In embodiments, the first DAC 1330 is a fine tuning 8-bit DAC, with its MSBs input (DB7:DB4) tied to fixed potentials (GND for logic low or VDD for logic high), its LSBs (DB3:DB0) controlled by MCU to provide a first control voltage (fine tuning) VT1 1332 for fine tuning a first APS 1350, which receives an RF input signal (RF1) at the first RF input port 1352 and outputs a first RF output signal (RF1out) at the first RF output port 1354 with a first desired phase shift to the RF input signal (RF1). The second DAC 1340 is a coarse tuning 8-bit DAC, with its LSBs input (DB3:DB0) tied to fixed potentials (GND for logic low or VDD for logic high), its MSBs (DB7:DB4) controlled by MCU to provide a second control voltage (coarse tuning) VT2 1342 for coarse tuning a second APS 1360, which receives the first RF output signal (RF1out) at the second RF input port 1362 and outputs a second RF output signal RF2 (or the final output) at the second RF output port 1364 with a second desired phase shift to the first RF output signal (RF1out). The reference voltage Vref1 of the first DAC 1330 and the reference voltage Vref2 of the second DAC 1340 may be provided from the same source (have the same voltage level) or be supplied separately (having different voltage levels). The first APS 1350 and the second APS 1360 are coupled in series to provide a desired phase shaft in total (the summation of the first and the second desired phase shifts) at the output signal RF2 with reference to the input signal RF1. In embodiments, the RF signal through RF1 and RF2 can be bi-directional, i.e., with RF1 being the input signal and RF2 being the output signal, or vice versa (RF2 being the input signal and RF1 being the output signal). In embodiments, the second DAC 1340 and the second APS 1360 can be replaced by a 4-bit digital phase shifter (DPS) which is controlled by the digital control signal (DB7:DB4) from MCU for coarse tuning. In embodiments, the second DAC 1340 has the same bits input as the bit number of the one or more bits from the digital control signal (e.g. a 4-bit DAC to receive 4 bits of the multi-bits digital control signal, instead of an 8-bit DAC with DB3:DB0 grounded) to provide a coarse control voltage to the second APS 1360.

By designating an APS (or a DPS) for coarse tuning and another APS for fine tuning, the phase shift apparatus 1300 may be implemented with a high linearity and reduced total amount of states needed to be pre-loaded in memory of MCU for overall phase shift control, which would be hard to achieve by a single APS.

One skilled in the art shall understand that the aforementioned temperature compensation embodiments may also be applicable to the phase shift apparatus 1300. For example, a temperature sensor may couple to the first DAC 1330 and/or second DAC 1340 to modify the reference voltage Vref1 and/or reference voltage Vref2 for proper temperature compensation. Such variations shall still be within the scope of this invention.

By incorporation digitalized control and temperature compensation to an analog phase shifter, the disclosed phase shift apparatus in various embodiments achieves high accuracy digitalized control, a flat phase shift over a wide bandwidth, and a stable phase shift over temperature variation.

The foregoing description of the invention has been described for purposes of clarity and understanding. It is not intended to limit the invention to the precise form disclosed. Various modifications may be possible within the scope and equivalence of the appended claims.

It will be appreciated to those skilled in the art that the preceding examples and embodiments are exemplary and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention.

It shall also be noted that elements of the claims, below, may be arranged differently including having multiple dependencies, configurations, and combinations. For example, in embodiments, the subject matter of various claims may be combined with other claims.

The invention claimed is:

1. A phase shift apparatus comprising:
    a microcontroller unit (MCU) to output a digital control signal corresponding to a desired phase shift, the digital control signal comprising a plurality of binary bits;
    a temperature sensor generating an output voltage indicating ambient temperature;
    a mixer coupled to receive the output voltage and a first reference voltage to output a modified reference voltage;
    a first digital-to-analog converter (DAC) coupled to the MCU and the mixer, the first DAC receives one or more bits from the digital control signal and outputs a first control voltage based at least on the received one or more bits and the modified reference voltage, the modified reference voltage corresponds to a maximum voltage output of the first DAC; and
    a first voltage controlled analog phase shifter (APS) receiving a radio frequency (RF) input signal via an RF input port and the first control voltage, the first APS outputs via an RF output port a first RF output signal with the desired phase shift angle with reference to the RF input signal under the control of the first control voltage.

2. The phase shift apparatus of claim 1 further comprising a memory incorporated within the MCU or accessible by the MCU, the memory is preloaded with a lookup table that relates each one of a plurality of phase shift angles to a specific state of the digital control signal.

3. The phase shift apparatus of claim 2, wherein the MCU retrieves a desired state from the lookup table corresponding to the desired phase shift and generates the digital control signal with the desired state.

4. The phase shift apparatus of claim 1 wherein the mixer implements an addition or subtraction of the output voltage to the reference voltage to generate the modified reference voltage, the output voltage is weighted for the addition or subtraction implementation.

5. The phase shift apparatus of claim 1 further comprising:
    a second DAC coupled to the MCU, the second DAC receives one or more bits from the digital control signal and a second reference voltage to output a second control voltage, the one or more bits received by the second DAC are different bits from the one or more bits received by the first DAC; and
    a second voltage controlled APS coupled to the first voltage controlled APS in series, the second voltage controlled APS receives the second control voltage and the first RF output signal from the first voltage controlled APS, the second APS generates a second RF output signal with a desired phase shift angle with reference to the first RF output signal under the control of the second control voltage.

6. The phase shift apparatus of claim 5 wherein the second reference voltage is not temperature compensated.

7. The phase shift apparatus of claim 5 wherein the first DAC and the first APS are for fine phase shift tuning of the phase shift apparatus, the second DAC and the second APS are for coarse phase shift tuning of the phase shift apparatus.

8. The phase shift apparatus of claim 1 wherein the RF input port and RF output port of APS are interchangeable.

9. A phase shift apparatus comprising:
    a microcontroller unit (MCU) to output a digital control signal, the digital control signal comprising a plurality of binary bits;
    a first digital-to-analog converter (DAC) coupled to the MCU, the first DAC receives one or more bits from the digital control signal and a first reference voltage to output a first control voltage based at least on the received one or more bits and the first reference voltage, the first reference voltage corresponds to a maximum voltage output of the first DAC;
    a first voltage controlled analog phase shifter (APS) receiving a radio frequency (RF) input signal via an RF input port and the first control voltage, the first APS outputs via an RF output port a first RF output signal with a first phase shift angle with reference to the RF input signal under the control of the first control voltage;
    a second DAC coupled to the MCU, the second DAC receives one or more bits from the digital control signal and a second reference voltage to output a second control voltage, the second reference voltage corresponds to a maximum voltage output of the second DAC, the one or more bits received by the second DAC are different bits from the one or more bits received by the first DAC; and a second voltage controlled APS coupled to the first voltage controlled APS in series, the second voltage controlled APS receives the second control voltage and the first RF output signal from the first voltage controlled APS, the second APS generates a second RF output signal at a second RF output port with a second desired phase shift angle with reference to the first RF output signal under the control of the second control voltage.

10. The phase shift apparatus of claim 9 wherein the one or more bits received by the first DAC are least significant bits (LSBs) of the digital control signal, the one or more bits received by the second DAC are most significant bits (MSBs) of the digital control signal.

11. The phase shift apparatus of claim 9 wherein the first DAC and the first APS are for fine phase shift tuning of the phase shift apparatus, the second DAC and the second APS are for coarse phase shift tuning of the phase shift apparatus.

12. The phase shift apparatus of claim 11 wherein the first reference voltage is temperature compensated, the second reference voltage is not temperature compensated.

13. The phase shift apparatus of claim 9 wherein the first RF input port and the second RF output port are interchangeable.

14. A phase shift apparatus comprising:
a temperature sensor generating an output voltage indicating ambient temperature;
an analog-to-digital converter (ADC) generating a digitalized temperature based on the output voltage from the temperature sensor;
a microcontroller unit (MCU) generating an adjusted digital control signal based on the digitalized temperature signal and a digital control signal state retrieved from a lookup table in correspondence to a desired phase shift angle;
a digital-to-analog converter (DAC) generating a temperature compensated control voltage based on the adjusted digital control signal and a reference voltage; and
a voltage controlled analog phase shifter (APS) receiving a radio frequency (RF) input signal and the control voltage, the APS generates an RF output signal with the desired phase shift angle with reference to the RF input signal under the control of the temperature compensated control voltage.

15. The phase shift apparatus of claim 14 wherein the lookup table is stored in a memory incorporated within the MCU or accessible by the MCU, the lookup table relates each one of a plurality of phase shift angles to a specific state of the digital control signal.

16. The phase shift apparatus of claim 15 wherein the lookup table is created during a test stage of the voltage controlled APS.

17. The phase shift apparatus of claim 16 wherein the test stage may comprise tests performed at various control voltages under one or more frequencies.

18. The phase shift apparatus of claim 16 wherein the test stage may comprise tests performed at various control voltages under one or more temperatures.

19. The phase shift apparatus of claim 14 wherein the reference voltage corresponds to a maximum voltage output of the DAC, the reference voltage is capable to control the APS to generate a phase shift for 360 degree or more.

20. The phase shift apparatus of claim 14 where the RF input and RF output of APS are interchangeable.

* * * * *